(12) United States Patent
Kim et al.

(10) Patent No.: US 12,339,722 B2
(45) Date of Patent: Jun. 24, 2025

(54) STORAGE DEVICE AND A POWER MANAGEMENT DEVICE

(71) Applicant: SAMSUNG ELECTRONICS CO., LTD., Suwon-si (KR)

(72) Inventors: Daewon Kim, Hwaseong-si (KR); Seungjun Oh, Seongnam-si (KR); Junwoo Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 17/898,588

(22) Filed: Aug. 30, 2022

(65) Prior Publication Data

US 2023/0176640 A1 Jun. 8, 2023

(30) Foreign Application Priority Data

Dec. 6, 2021 (KR) .................. 10-2021-0172934
Feb. 22, 2022 (KR) .................. 10-2022-0022754

(51) Int. Cl.
| | |
|---|---|
| *G06F 1/28* | (2006.01) |
| *G06F 1/26* | (2006.01) |
| *G06F 1/3225* | (2019.01) |
| *G06F 9/4401* | (2018.01) |
| *G06F 11/14* | (2006.01) |

(52) U.S. Cl.
CPC .............. *G06F 1/28* (2013.01); *G06F 1/266* (2013.01); *G06F 1/3225* (2013.01); *G06F 1/26* (2013.01); *G06F 9/4401* (2013.01); *G06F 9/4411* (2013.01); *G06F 11/1417* (2013.01)

(58) Field of Classification Search
CPC ... G06F 1/28; G06F 1/26; G06F 1/266; G06F 1/3225; G06F 9/4401; G06F 9/4411; G06F 11/1417
USPC .................. 713/1, 2, 100, 300, 340; 714/6.1
See application file for complete search history.

(56) References Cited

U.S. PATENT DOCUMENTS

| | | | |
|---|---|---|---|
| 7,788,508 B1 * | 8/2010 | Salmi ...................... | G06F 1/324 713/300 |
| 9,361,030 B2 | 6/2016 | Tuers et al. | |
| 9,535,614 B2 | 1/2017 | Reddy et al. | |
| 10,936,246 B2 | 3/2021 | Cadloni et al. | |
| 2004/0041607 A1 * | 3/2004 | Pan ...................... | G11C 7/1051 327/170 |

(Continued)

FOREIGN PATENT DOCUMENTS

KR 10-2006-0116246 11/2006

*Primary Examiner* — Ji H Bae
(74) *Attorney, Agent, or Firm* — MORGAN, LEWIS & BOCKIUS LLP

(57) ABSTRACT

A storage device including: a controller configured to be connected to an external host through an interface; a plurality of memory devices configured to store data; and a power management device configured to output an internal power voltage for an operation of the plurality of memory devices using an external power voltage received through the interface and having a flag signal pad for receiving a flag signal from the controller when the controller fails to recognize at least one of the plurality of memory devices, wherein, when the flag signal is received, the power management device changes a slope of the internal power voltage, and supplies the internal power voltage having the changed slope to the plurality of memory devices.

9 Claims, 15 Drawing Sheets

(56) References Cited

U.S. PATENT DOCUMENTS

| | | | |
|---|---|---|---|
| 2005/0117433 A1* | 6/2005 | Fujisawa | G11C 7/1069 |
| | | | 365/226 |
| 2009/0024856 A1* | 1/2009 | Lee | G06F 1/3296 |
| | | | 713/320 |
| 2010/0246295 A1* | 9/2010 | Jang | G11C 7/222 |
| | | | 365/207 |
| 2016/0180953 A1 | 6/2016 | Darragh et al. | |
| 2018/0067541 A1* | 3/2018 | Chuang | G06F 1/305 |
| 2020/0019453 A1 | 1/2020 | Chew et al. | |
| 2021/0391000 A1* | 12/2021 | Lee | G11C 16/0483 |
| 2022/0068319 A1* | 3/2022 | Bonitz | G11C 5/143 |

\* cited by examiner

STORAGE DEVICE AND A POWER MANAGEMENT DEVICE

CROSS-REFERENCE TO RELATED APPLICATION(S)

This application claims priority under 35 U.S.C. § 119(a) to Korean Patent Application No. 10-2021-0172934 filed on Dec. 6, 2021, and Korean Patent Application No. 10-2022-0022754 filed on Feb. 22, 2022 in the Korean Intellectual Property Office, the disclosures of which are incorporated by reference herein in their entireties.

TECHNICAL FIELD

The present inventive concept relates to a storage device and a power management device.

DISCUSSION OF RELATED ART

A storage device, e.g., a volatile or non-volatile memory, may be connected to an external host to transmit and receive data. The storage device may include a controller, a memory device for storing data, and a power management device coupled to the controller. The power management device may generate an internal power voltage required for an operation of the controller and the memory device using an external power voltage supplied from the external host. However, depending on a slope at which an internal power voltage is supplied, the controller may not normally recognize the memory device, thereby causing the user to recognize the storage device as defective, and reliability of the storage device to drop.

SUMMARY

Example embodiments of the present inventive concept provide a storage device that includes a power management device, a controller and a memory device and when the controller fails to normally recognize the memory device, the power management device changes a slope of an internal power voltage and supplies power again to the memory device, thereby increasing operation stability and reliability.

According to example embodiments of the present inventive concept, there is provided a storage device including: a controller configured to be connected to an external host through an interface; a plurality of memory devices configured to store data; and a power management device configured to output an internal power voltage for an operation of the plurality of memory devices using an external power voltage received through the interface and having a flag signal pad for receiving a flag signal from the controller when the controller fails to recognize at least one of the plurality of memory devices, wherein, when the flag signal is received, the power management device changes a slope of the internal power voltage, and supplies the internal power voltage having the changed slope to the plurality of memory devices.

According to example embodiments of the present inventive concept, there is provided a power management device for generating an internal power voltage using an external power voltage received through an interface, the power management device including: a temperature sensor configured to output temperature information corresponding to an ambient temperature; a data table configured to store a slew rate of the internal power voltage, wherein the slew rate of the internal power voltage corresponds to the ambient temperature: a flag signal pad connected to a controller and configured to receive a flag signal from the controller; and a power circuit configured to change the slew rate of the internal power voltage with reference to the temperature information and the data table, when the flag signal having a first voltage level is received through the flag signal pad.

According to example embodiments of the present inventive concept, there is provided a storage device including: a power management device configured to generate an internal power voltage using an external power voltage received through an interface; a plurality of memory devices configured to be turned on by the internal power voltage; and a controller configured to exchange data with an external device through the interface, wherein the power management device repeats an operation of resetting power of the plurality of memory devices, while changing a slope of the internal power voltage, until the controller recognizes all of the plurality of memory devices during an initial driving.

BRIEF DESCRIPTION OF THE DRAWINGS

The above and other features of the present inventive concept will be more clearly understood from the following detailed description, taken in conjunction with the accompanying drawings, in which.

DETAILED DESCRIPTION OF THE EMBODIMENTS

Hereinafter, example embodiments of the present inventive concept will be described with reference to the accompanying drawings.

Figure 1:
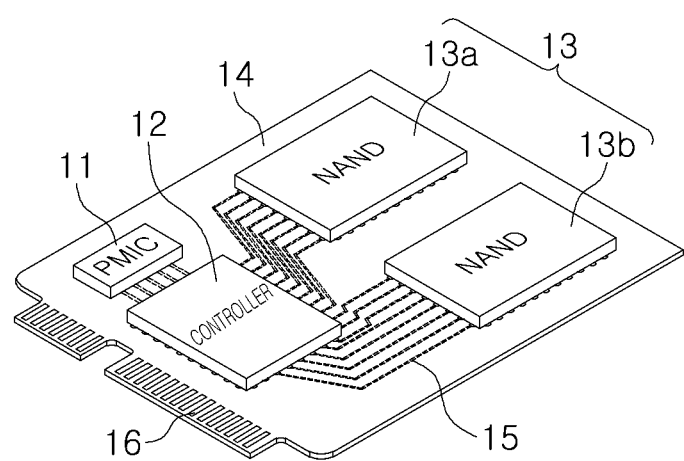
FIGS. 1 and 2 are diagrams briefly illustrating storage devices according to an example embodiment of the present inventive concept.
Figure 2:
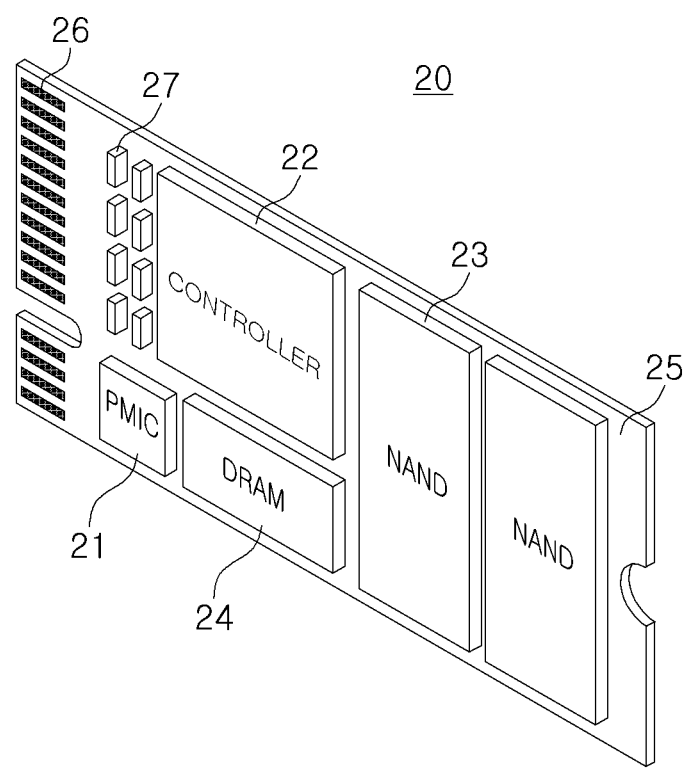

FIGS. 1 and 2 are diagrams briefly illustrating storage devices according to an example embodiment of the present inventive concept.

In the example embodiments described with reference to FIGS. 1 and 2, each of the storage devices 10 and 20 may be a solid state drive device. First, referring to FIG. 1, a storage device 10 according to an example embodiment of the present inventive concept may include a power management device 11, a controller 12, a plurality of memory devices 13a-13b: 13, and the like. The power management device 11, the controller 12, and the memory devices 13 may be connected to each other by wiring patterns 15 formed on a system board 14.

The system board 14 may include a connector 16 including a plurality of pins for coupling to an external host. The number and arrangement of the plurality of pins included in the connector 16 may vary depending on a communication interface between the storage device 10 and an external host. In example embodiments of the present inventive concept, the storage device 10 may communicate with an external host according to any one of interfaces such as a universal serial bus (USB), peripheral component interconnect express (PCI-Express), serial advanced technology attachment (SATA), an M-Phy for a universal flash storage (UFS), etc. For example, the storage device 10 according to the example embodiment shown in FIG. 1 may have a form factor such as a 2.5 inch disk drive, and may communicate with other external devices according to a SATA protocol.

The storage device 10 may be operated by an external power voltage and a control command transmitted from an external host through the connector 16. The power management device 11 of the storage device 10 may be a power management integrated circuit (PMIC) for generating internal power voltages necessary for the operation of the controller 12 and the memory devices 13 using an external power voltage supplied from the external host through the connector 16.

According to an example embodiment of the present inventive concept, some voltages necessary for the operation of the memory devices 13 may be directly input to the memory devices 13 from an external host through the connector 16 without going through the power management device 11. In other words, the power management device 11 may be bypassed. For example, the input/output power voltage required for the operation of the circuit for inputting/outputting data to/from the memory devices 13 may be directly input to the memory devices 13 from the connector 16 without going through the power management device 11.

The controller 12 may write data to or read data from the memory devices 13 and may exchange data with an external host. The memory devices 13 may include first and second memory devices 13a and 13b separated from each other, and each of the first and second memory devices 13a and 13b may include one or more memory chips. The memory chips may be NAND memory chips, and the controller 12 may include a NAND controller for controlling the NAND memory chips, a memory interface, and the like. According to an example embodiment of the present inventive concept, at least one of the first and second memory devices 13a and 13b may further include an interface chip for mediating communication between the controller 12 and the NAND memory chip.

Next, referring to FIG. 2, the storage device 20 according to an example embodiment of the present inventive concept may have a form factor according to the M.2 standard. The storage device 20 according to an example embodiment shown in FIG. 2 may communicate with an external host, for example, a central processing unit, a system-on-chip, an application processor, and the like according to a PCI-express protocol.

The storage device 20 may include a power management device 21, a controller 22, memory devices 23, a dynamic random access memory (DRAM) 24, and a system board 25. Configurations and operations of the power circuit 21, the controller 22, and the memory devices 23 may be similar to those described above with reference to FIG. 1.

The DRAM 24 may operate as a buffer memory to reduce a speed difference between the memory devices 23, which are data storage spaces, and an external host. The DRAM 24 included in the storage device 20 may also operate as a type of cache memory, and provide space for temporarily storing data in control operations such as program and read for the memory devices 23. The controller 22 may further include a DRAM controller for controlling the DRAM 24 in addition to the NAND controller for controlling the memory devices 23 including NAND memory chips.

The system board 25 includes a connector 26 for connection to an external host, and at least one integrated circuit 27 may be further mounted on the system board 25. For example, the integrated circuits 27 may include a distribution circuit for distributing internal power voltages output by the power management device 21 to the controller 22, the memory devices 23, the DRAM 24, and the like. In addition, passive elements necessary for the operation of the storage device 20 may also be mounted on the system board 25.

When the storage devices 10 and 20 are connected to the host, the host may output an external power voltage to the connectors 16 and 26. The external power voltage may be converted into an internal power voltage in the power management devices 11 and 21, and the power management devices 11 and 21 may output the internal power voltage to the controllers 12 and 22 and the memory devices 13 and 23, etc.

However, even when the internal power voltage rises to a target level, the controllers 12 and 22 may not normally recognize at least one of the memory devices 13 and 23 according to a rate at which the internal power voltage increases to the target level, in other words, according to a slew rate or a slope. Such a failure may appear stochastically, and when the controllers 12 and 22 fail to recognize the memory devices 13 and 23, a user of the storage devices 10 and 20 may disconnect the storage devices 10 and 20 from an external host and reconnect the same. Accordingly, the reliability of the storage devices 10 and 20 may be deteriorated from the user's perspective.

In an example embodiment of the present inventive concept, in the above case, the controllers 12 and 22 may output a flag signal having a predetermined level to the power management devices 11 and 21. Upon receiving the flag signal, the power management devices 11 and 21 may change the slope of the internal power voltage to re-supply power to the memory devices 13 and 23. Accordingly, a situation in which the controller 12 and 22 fails to recognize at least one of the memory devices 13 and 23 may be resolved within the storage devices 10 and 20 before a user recognizes, and as a result, the reliability and user convenience of the storage devices 1 and 20 may be increased.

Figure 3:
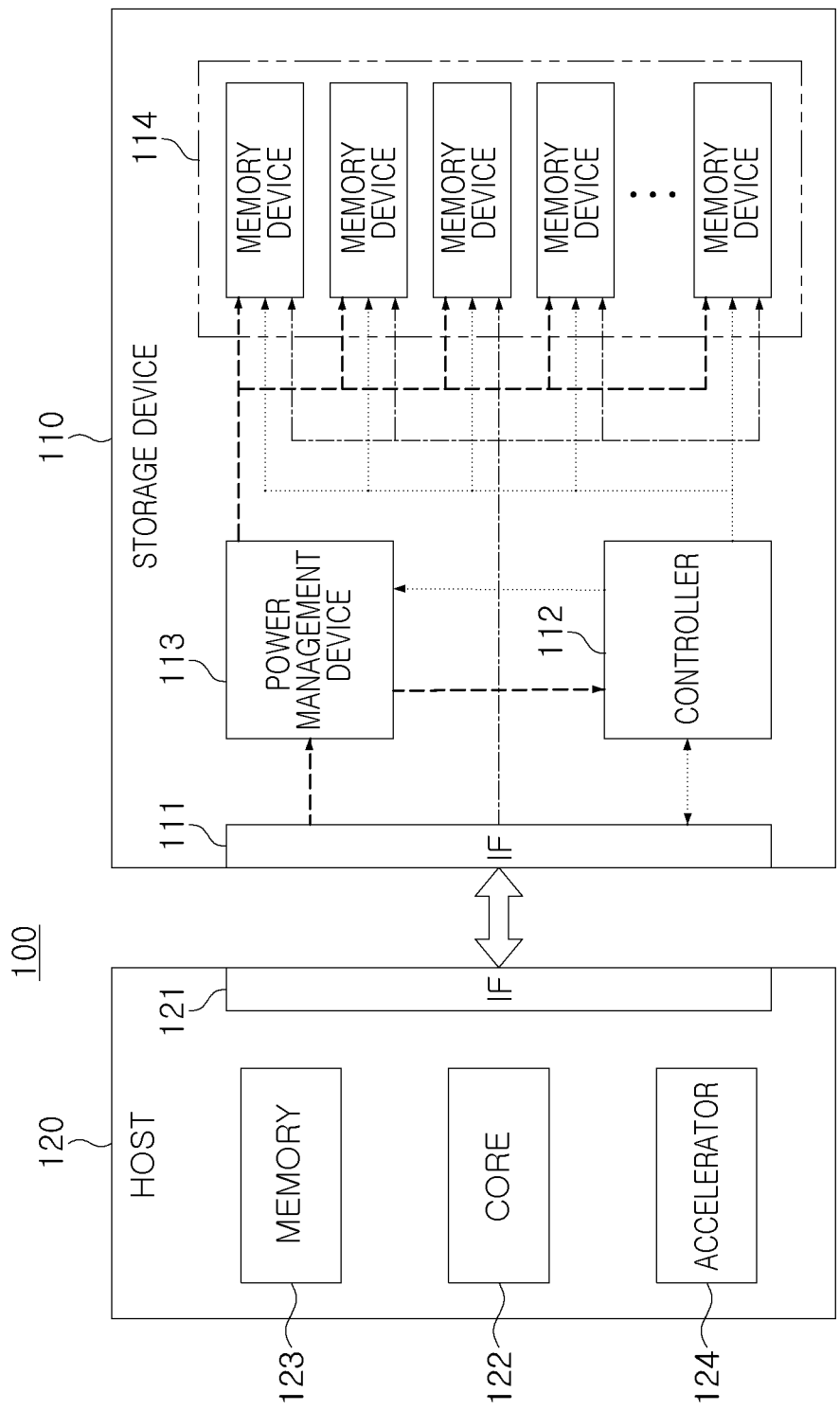
FIG. 3 is a schematic block diagram illustrating a system including a storage device according to an example embodiment of the present inventive concept.

FIG. 3 is a schematic block diagram illustrating a system including a storage device according to an example embodiment of the present inventive concept.

Referring to FIG. 3, a system 100 including a storage device according to an example embodiment of the present inventive concept may include a storage device 110 and a host 120. The storage device 110 may be a solid state drive device, and may store data received from the host 120 in response to a control command of the host 120 or may output stored data to the host 120.

The host 120 may be implemented as one of devices such as a central processing unit (CPU), an application processor (AP), and a system-on-chip (SoC). The host 120 may include an interface 121 connected to the storage device 110, a core 122 for executing a main calculation, a memory 123, an accelerator 124, and the like. According to an example embodiment of the present inventive concept, the host 120 may include two or more cores 122, and the memory 123 may be a cache memory inside the host 120. The accelerator 124 may execute an artificial intelligence (AI) data calculation and the like.

The storage device 110 may include an interface 111, a controller 112, a power management device 113, a plurality of memory devices 114, and the like. The controller 112 may control the storage device 110 based on a control command received from the host 120 through the interface 111, receive data and store the data in the plurality of memory devices 114, or retrieve data stored in the plurality of memory devices 114 and output the data to the host 120. The control command may include address information, and the controller 112 may store data in at least one of the plurality of memory devices 114 with reference to address information or read data from at least one of the plurality of memory devices 114.

In addition, the storage device 110 may receive an external power voltage from the host 120 through the interface 111. The external power voltage received through the interface 111 may be input to the power management device 113, and the power management device 113 may output an internal power voltage required for an operation of the controller 112 and the plurality of memory devices 114 using the external power voltage. For example, the internal power voltage supplied by the power management device 113 to the controller 112 and the internal power voltage supplied to the plurality of memory devices 114 may have different levels.

The plurality of memory devices 114 may directly receive some of the power voltages required for operation from the host 120 through the interface 111. For example, the power voltage input to the plurality of memory devices 114 through the interface 111 without going through the power management device 113 may be an input/output power voltage required for input/output operation of each of the plurality of memory devices 114. A level of the input/output power voltage may be smaller than a level of the internal power voltage input by the power management device 113 to the plurality of memory devices 114.

When the storage device 110 is connected to the host 120 and an external power voltage is supplied to the power management device 113 through the interface 111, the power management device 113 may generate an internal power voltage and output the generated internal power voltage to the controller 112 and the plurality of memory devices 114. For example, when the level of the power voltage required for the operation of the controller 112 is smaller than the level of the power voltage required for the operation of the plurality of memory devices 114, power of the controller 112 may be turned on first.

The controller 112, which is turned on upon receiving power, may check a state of the plurality of memory devices 114 and recognize the plurality of memory devices 114. At this time, depending on a rate at which the internal power voltage supplied by the power management device 113 to the plurality of memory devices 114 increases to a target level, in other words, depending on a slope or slew rate of the internal power voltage, the controller 112 may fail to recognize at least one of the plurality of memory devices 114. In this case, the controller 112 may determine at least one of the plurality of memory devices 114 to be defective even though a substantial defect does not exist in the at least one of the plurality of memory devices 114.

In an example embodiment of the present inventive concept, when an external power voltage is supplied to the storage device 110 and the controller 112 fails to recognize at least one of the plurality of memory devices 114, a flag signal may be output to the power management device 113. For example, the controller 112 may output the flag signal to the power management device 113. The power management device 113 may change the slope of the internal power voltage input to the plurality of memory devices 114 in response to the flag signal, and may supply the internal power voltage increasing to a target level to the plurality of memory devices 114 according to the changed slope. In other words, the power management device 113 may cause the internal power voltage to reach the target level at a faster pace. Accordingly, defects that occur stochastically due to the slope of the internal power voltage during the initial driving of the storage device 110 may be internally resolved in the storage device 110, and the reliability of the storage device 110 may be increased by ensuring continuous use of the storage device 110 to the user.

For example, a defect in which the controller 112 fails to recognize the plurality of memory devices 114 due to the slope of the internal power voltage may occur when slopes are different from each other depending on a temperature of the operating environment of the storage device 110. Therefore, after receiving the flag signal from the controller 112, the power management device 113 may first detect a temperature using a temperature sensor, and the controller 112 may output the internal power voltage by selecting a slope having a low probability of failure to recognize the plurality of memory devices 114 according to the temperature.

In an example embodiment of the present inventive concept, a data table accessible by the power management device 113 may be stored in the storage device 100. In the data table, slopes applicable to the internal power voltage may be matched and recorded according to temperature. As an example, the data table may store a defect rate, which is a probability of failure for the controller 112 to recognize the plurality of memory devices 114 when the internal power voltage having each slope is supplied to the plurality of memory devices 114, together with the slopes applicable to the internal power voltage according to temperature.

When a temperature is detected after receiving the flag signal from the controller 112, the power management device 113 may select an appropriate slope from the data table according to the detected temperature, and output the internal power voltage increased according to the selected slope to the plurality of memory devices 114. In other words, the power management device 113 may increase the internal power voltage according to the selected slope. For example, the power management device 113 may select a slope having the lowest defect rate from among the slopes applicable to the internal power voltage by referring to the data table. When two or more slopes having the lowest defect rate exist, the power management device 113 may select the fastest slope from among the two or more slopes to implement a fast response speed and apply the selected slope to the internal power voltage.

Although the power management device 113 applies each of the slopes recorded in the data table to the internal power voltage at least once and supplies the internal power voltage to the plurality of memory devices 114, if the controller 112 fails to recognize all of the plurality of memory devices 114, the controller 112 may determine that all of the plurality of memory devices 114 have failed to be recognized. This is referred to as a final failure. The controller 112 may output the failure occurrence fact to the user and/or an administrator of the system 100.

Figure 4:
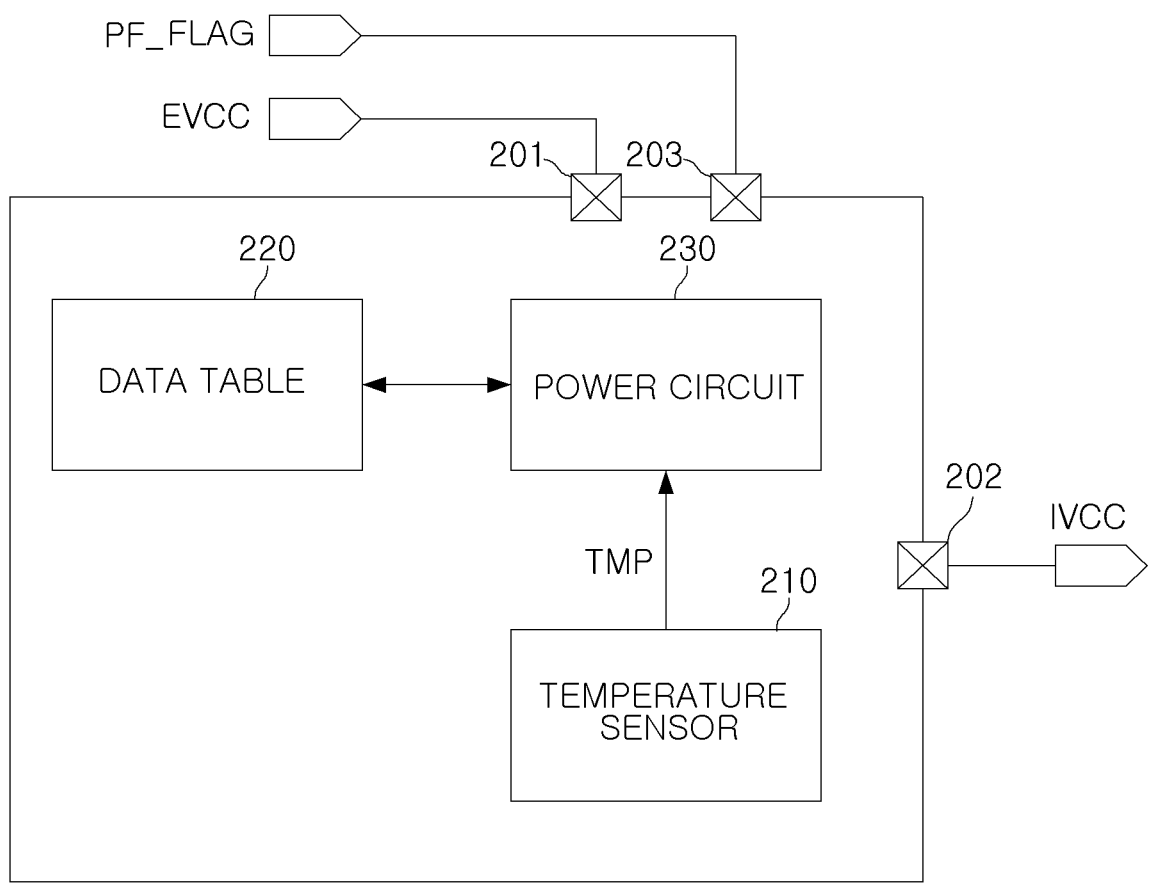
FIG. 4 is a schematic block diagram illustrating a system including a power management device according to an example embodiment of the present inventive concept.

FIG. 4 is a block diagram briefly illustrating a power management device according to an example embodiment of the present inventive concept.

Referring to FIG. 4, a power management device 200 according to an example embodiment of the present inventive concept may include a temperature sensor 210, a data table 220, and a power circuit 230. In addition, the power management device 200 may include a first pad 201 connected to an interface and receiving an external power voltage EVCC, a second pad 202 outputting an internal power voltage IVCC to the controller and/or the memory device, and a third pad 203 receiving a flag signal PF_FLAG from the controller.

The temperature sensor 210 may include at least one transistor and may output temperature information TMP, which is a signal having different levels according to temperatures. The data table 220 may store a slope value that determines an increase rate of the internal power voltage IVCC output from the power circuit 230. For example, the data table 220 may match a level of the temperature information TMP to slope values of the internal power voltage IVCC and store the same.

The power circuit 230 may generate the internal power voltage IVCC by using the external power voltage EVCC. For example, the power circuit 230 may output the internal power voltage IVCC by changing a level of the external power voltage EVCC. The internal power voltage IVCC output from the power circuit 230 may increase from a reference level, for example, a ground level, to a target level. A slope of the internal power voltage IVCC may be a rate at which the level of the internal power voltage IVCC increases from the reference level to the target level.

As described above, in the storage device including the power management device 200, the controller may fail to recognize at least one of the plurality of memory devices according to the slope of the internal power voltage IVCC. For example, when the internal power voltage IVCC increases to a target level according to the first slope, the controller may fail to recognize at least one of the plurality of memory devices. However, when the internal power voltage IVCC increases to the target level according to a second slope different from the first slope, the controller may normally recognize all of the plurality of memory devices. For example, the second slope may be greater than the first slope.

When the power management device 200 according to an example embodiment of the present inventive concept outputs the internal power voltage IVCC that increases to the target level according to the first slope, if the controller does not normally recognize the plurality of memory devices, the power management device 200 may output the internal power voltage IVCC that increases to the target level according to the second slope. In other words, the power management device 200 may be switched from outputting the internal power voltage IVCC that increases to the target level according to the first slope to outputting the internal power voltage IVCC that increases to the target level according to the second slope. For example, the controller that does not normally recognize the plurality of memory devices may transmit the flag signal PF_FLAG having a predetermined first voltage level to the power management device 200 through the third pad 203. The power management device 200 may determine whether to output the internal power voltage IVCC by changing the slope of the internal power voltage IVCC by referring to the level of the flag signal PF_FLAG.

Both the first slope and the second slope may be slope values stored in the data table 220. For example, the first slope may be a default slope, and the power management device 200 may set the internal power voltage IVCC to increase to the target level according to the first slope during initial driving. After outputting the internal power voltage IVCC having the first slope, when the flag signal PF_FLAG having the first voltage level is received, the power management device 200 may stop outputting the internal power voltage IVCC. Thereafter, the power circuit 230 may change the slope of the internal power voltage IVCC to the second slope and output the internal power voltage IVCC again. For example, the power circuit 230 may repeat the operation of stopping the outputting of the internal power voltage IVCC and outputting the internal power voltage IVCC again by changing the slope of the internal power voltage IVCC until the level of the flag signal PF_FLAG is reduced to the second voltage level different from the first voltage level.

Figure 5:
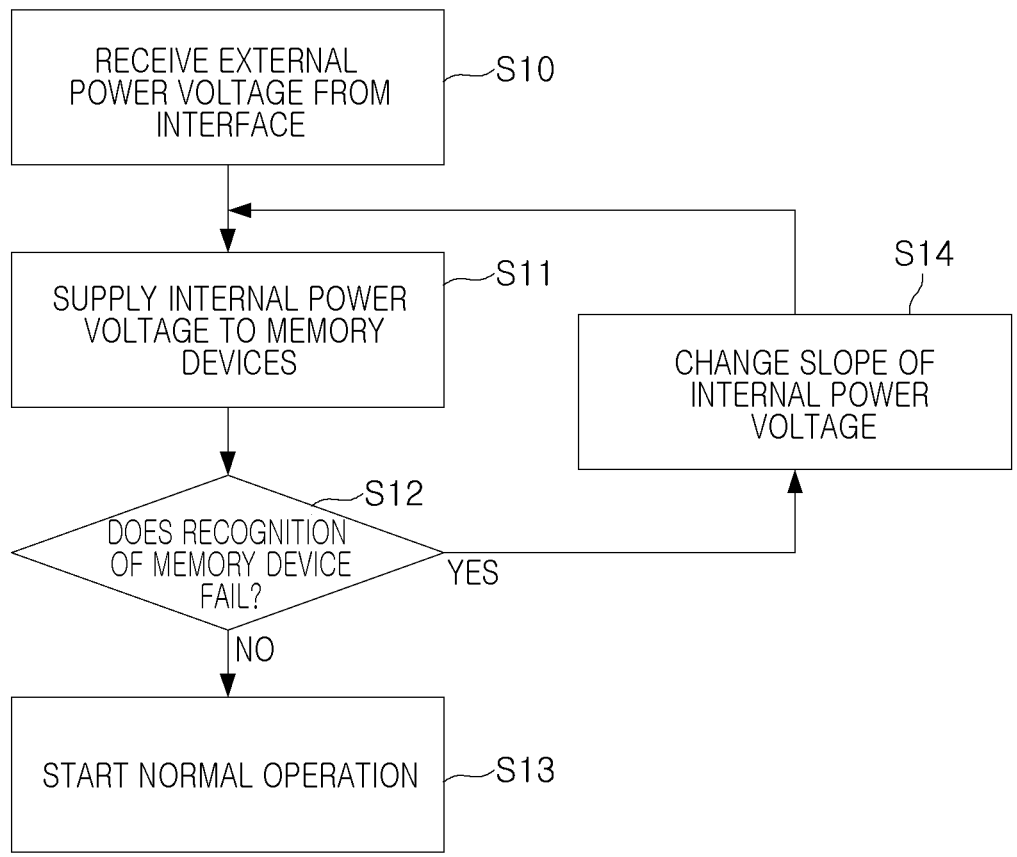
FIG. 5 is a flowchart provided to illustrate an operation of a storage device according to an example embodiment of the present inventive concept.

FIG. 5 is a flowchart illustrating an operation of a storage device according to an example embodiment of the present inventive concept.

Referring to FIG. 5, the operation of the storage device according to an example embodiment of the present inventive concept may be started by receiving an external power voltage through an interface (S10). The storage device may be connected to a host through one of various types of interfaces, for example, USB, SATA, PCI-Express, and the like, and may receive an external power voltage output from the host. For example, the interface may include pads for receiving an external power voltage and pads for receiving a control command from the host, and the number of pads receiving the external power voltage and the number of pads receiving the control command are may be different.

When the external power voltage starts to be supplied, the power management device included in the storage device may generate an internal power voltage using the external power voltage and supply the generated internal power voltage to a plurality of memory devices and the controller (S11). In some example embodiments of the present inventive concept, the internal power voltage supplied to the controller may have a level different from that of the internal power voltage supplied to the memory devices. For example, the internal power voltage supplied to the controller may be less than that supplied to the memory devices.

When the controller is powered on by the internal power voltage supplied by the power management device, the controller may attempt to recognize the memory devices (S12). If the controller succeeds in recognizing the memory devices, the storage device may start to operate normally (S13). On the other hand, if the controller fails to recognize at least one of the memory devices, the controller may control the power management device to change the slope of the internal power voltage (S14).

For example, the controller may output a flag signal informing the power management device that recognition of at least one of the memory devices has failed. The power management device may be previously set to change the slope of the internal power voltage and output the internal power voltage again according to the level of the flag signal.

FIGS. 6 to 9 are diagrams illustrating an operation of a memory device included in a storage device according to an example embodiment of the present inventive concept.

FIGS. 6 to 9 may be graphs illustrating a probability of failure that the controller fails to recognize a memory device according to the slope of the internal power voltage supplied to the memory device. In the graphs shown in FIGS. 6 to 9, a voltage slope of the horizontal axis may have a unit of time/voltage.

Referring to FIGS. 6 to 9, in memory devices, the probability of occurrence of a defect may appear to be different depending on the slope of the internal power voltage. First, in the case of the first memory device according to the example embodiment of the present inventive concept illustrated in FIG. 6, when an internal power voltage having a slope of about 2000 μs/V is supplied, the controller may not recognize the first memory device with a certain probability. In the case of the second memory device according to an example embodiment of the present inventive concept shown in FIG. 7, when an internal power voltage having a slope having a smaller and wider range than that of the first memory device is supplied, the controller may fail to recognize the second memory device.

Figure 8:
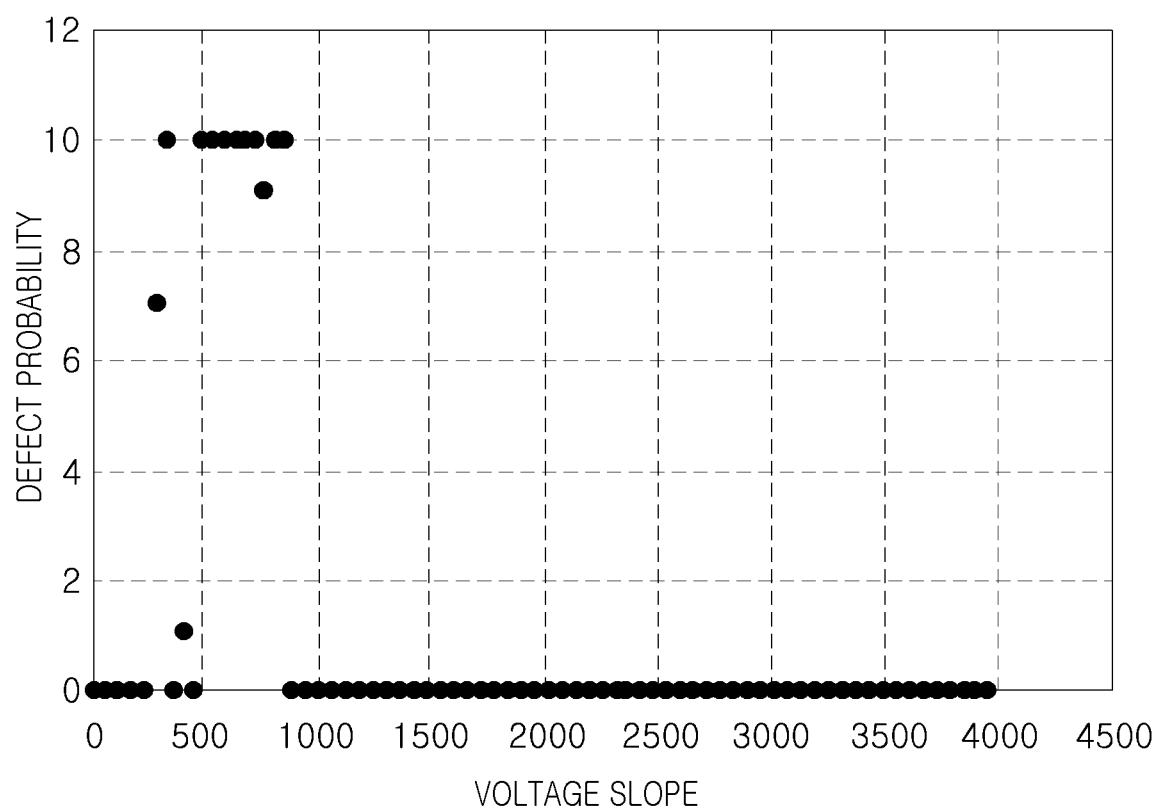
Figure 9:
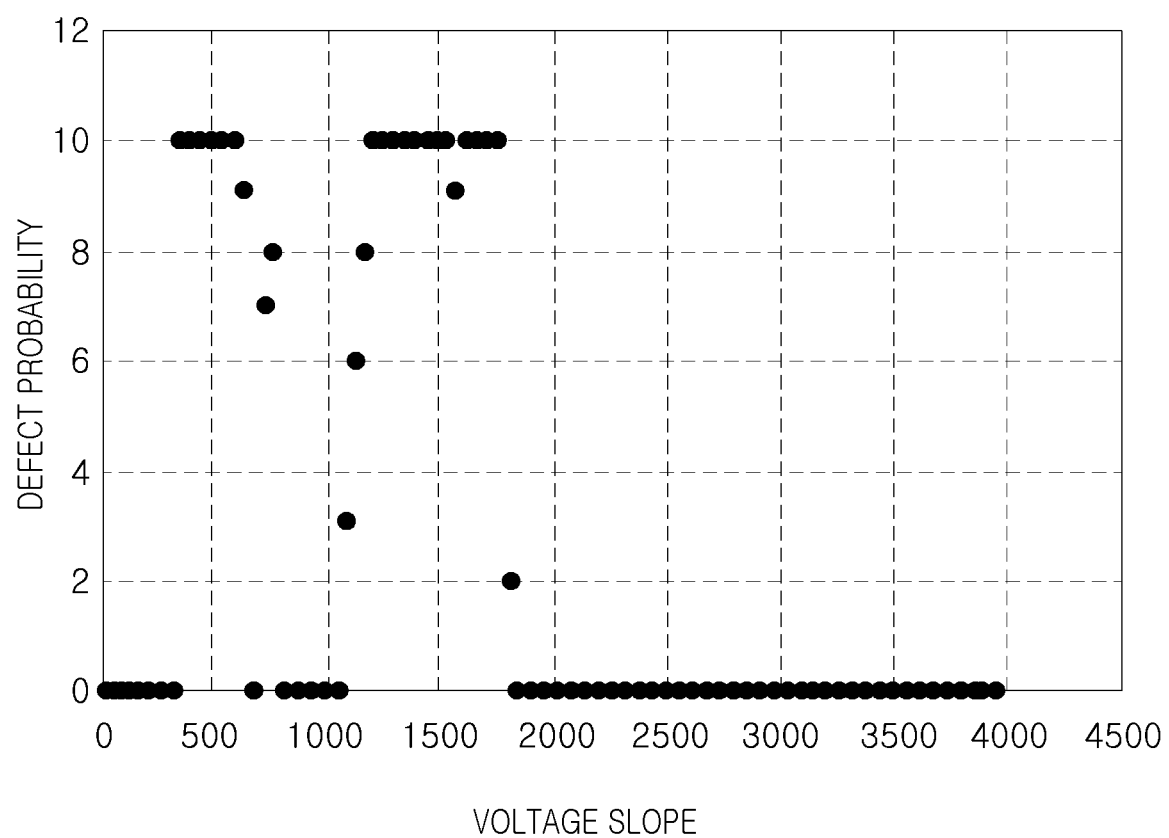

Referring to FIG. 8, when an internal power voltage having a slope of 300 to 800 μs/V is supplied to the third memory device, there may be a probability of failure that the controller fails to recognize the third memory device. Referring to FIG. 9, when an internal power voltage having a slope in the range of 400 to 700 μs/V and an internal power voltage having a slope in the range of 1000 to 1600 μs/V is supplied to the fourth memory device, the controller may fail to recognize the fourth memory device.

Figure 6:
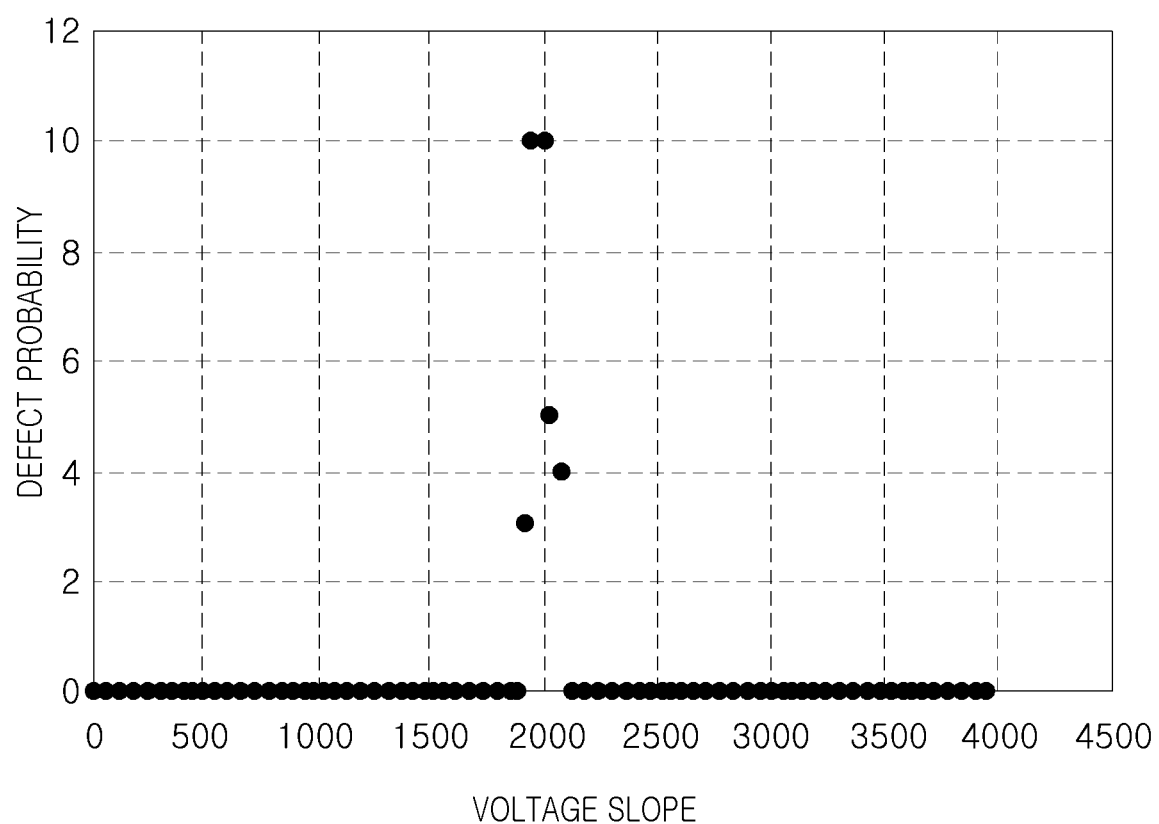
FIGS. 6, 7, 8 and 9 are diagrams illustrating an operation of a memory device included in a storage device according to an example embodiment of the present inventive concept.
Figure 7:
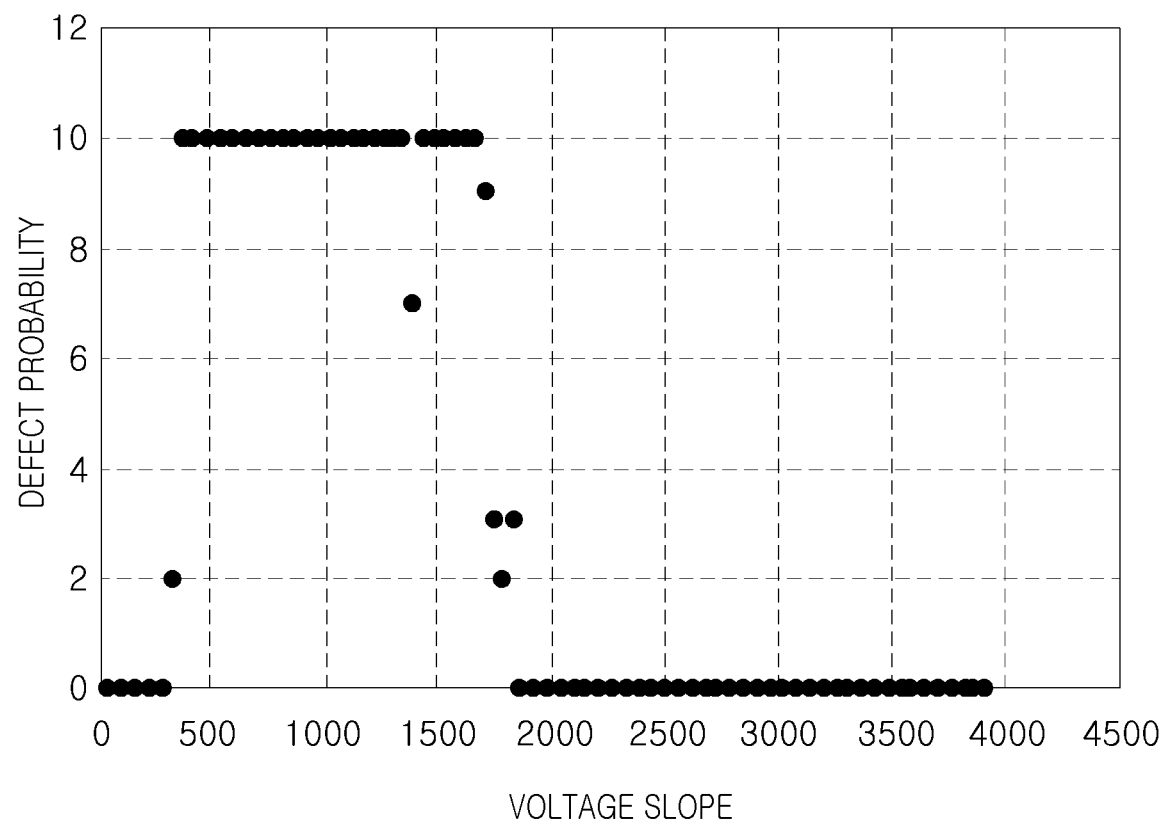

Whether the controller fails or succeeds in recognizing the memory device according to the slope of the internal power voltage may be a defect that appears probabilistically as described with reference to FIGS. 6 to 9. For example, even when an internal power voltage increasing at a slope of 2000 μs/V is supplied to the first memory device, the controller may succeed in recognizing the first memory device. This is because, as shown in FIG. 6, when an internal power voltage increasing at a slope of 2000 μs/V is input to the first memory device, the probability that the controller fails to recognize the first memory device is 10%.

When the controller fails to recognize the memory device during the initial driving of the storage device due to the slope of the internal power voltage, the controller may normally recognize the memory device only by changing the slope of the internal power voltage. To accomplish this, in an example embodiment of the present inventive concept, as described above, when the controller fails to recognize the memory device during the initial driving of the storage device, the power management device may change the slope of the internal power voltage and supply the internal power voltage back to the memory device. Accordingly, it is possible to prevent recognition failures of a memory device that may probabilistically occur during the initial operation of the storage device, and thus, the user does not have to perform unnecessary tasks such as disconnecting and reconnecting the storage device from/to the host.

In the memory devices according to the example embodiments illustrated in FIGS. 6 to 9, when the slope of the internal power voltage is set to be very small, it is possible to suppress a recognition failure from occurring at a specific slope of the internal power voltage. However, when the default slope of the internal power voltage is set to be very small, a time required for the initial driving of the storage device may be increased, which may result in lower a response speed of the storage device, thereby reducing user convenience. In an example embodiment of the present inventive concept, the slope of the internal power voltage is changed only when the recognition of the memory device receiving the internal power voltage increasing to the target level according to the default slope fails, thereby effectively preventing the recognition failure of the memory device without degrading the response speed.

In addition, a probability of failure that the controller fails to recognize the memory device on a specific slope of the internal power voltage may vary depending on an internal and/or ambient temperature of the storage device. Accordingly, according to an example embodiment of the present inventive concept, the slope of the internal power voltage may be adjusted to be different according to the internal and/or ambient temperature of the storage device, and as a result, the recognition failure of the memory device may be rapidly corrected. This will be described in more detail with reference to FIGS. 10 and 11 hereinafter.

Figure 10:
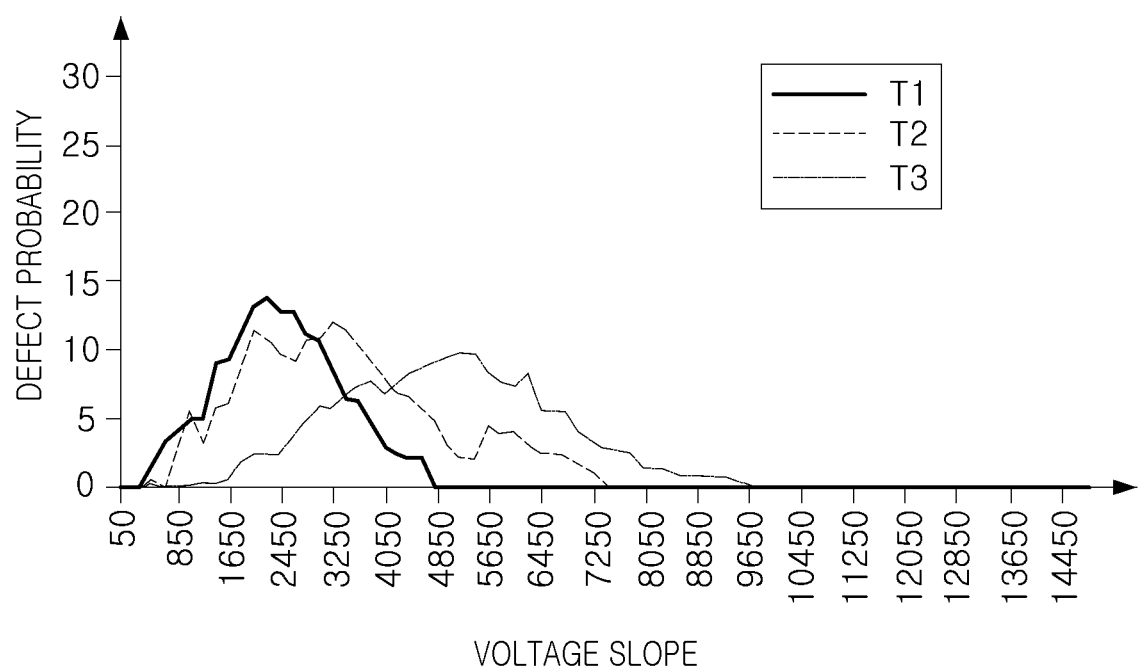
FIGS. 10 and 11 are diagrams illustrating an operation of a power management device according to an example embodiment of the present inventive concept.
Figure 11:
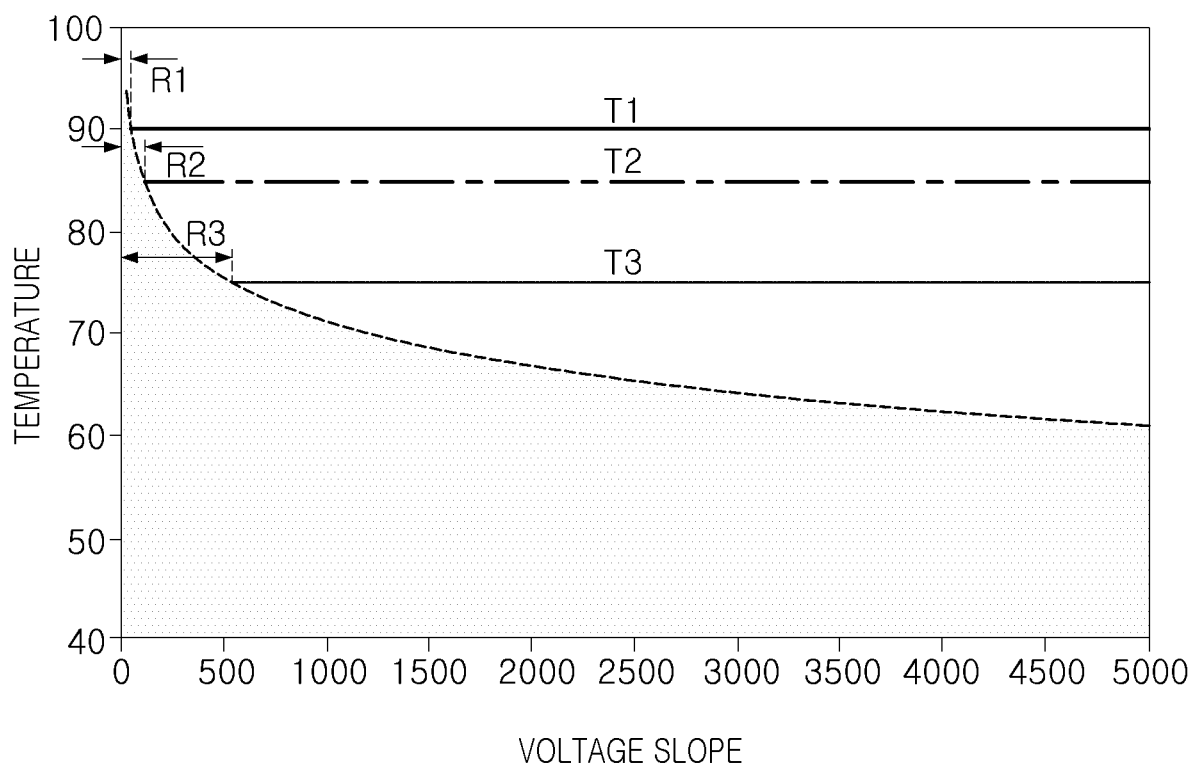

FIGS. 10 and 11 are diagrams illustrating an operation of a power management device according to an example embodiment of the present inventive concept.

First, referring to FIG. 10, a first graph is a graph showing a probability of failure according to a slope of the internal power voltage at a first temperature $T_1$, and a second graph is a graph showing a probability of failure according to a slope of the internal power voltage at a second temperature $T_2$. In addition, a third graph may be a graph showing a probability of failure according to a slope of the internal power voltage at a third temperature $T_3$.

In an example embodiment illustrated in FIG. 10, the first temperature $T_1$ may be higher than the second temperature $T_2$ and the third temperature $T_3$ may be lower than the second temperature $T_2$. In other words, the first temperature $T_1$ may be the highest temperature and the third temperature $T_3$ may be the lowest temperature.

Referring to the first graph, the probability of failure that the controller fails to recognize the memory device may be the highest when the internal power voltage having a slope of about 2200 μs/v is supplied to the memory device at the first temperature $T_1$. Referring to the second graph, the probability of failure that the controller fails to recognize the memory device may be the highest when the internal power voltage having a slope of about 3300 μs/v is supplied to the memory device at the second temperature $T_2$. Referring to the third graph, the probability of failure that the controller fails to recognize the memory device may be the highest when the internal power voltage having a slope of about 5400 μs/V is supplied to the memory device at the third temperature $T_3$.

In addition, referring to the distribution of the probability of failure in each of the first to third graphs, the probability of failure in all of the first to third graphs may appear with a high probability when the slope of the internal power voltage falls within a specific range. For example, when the slope of the internal power voltage is very large or small, the probability of failure in all of the first to third graphs may decrease close to 0%. In the graph shown in FIG. 10, the slope corresponding to the horizontal axis may be expressed in units of μs/V, and thus, as the slope is smaller, the internal power voltage increases very fast, and as the slope is larger, the internal power voltage increases slowly.

However, as described above, when the default slope of the internal power voltage is set to be very small, the response speed of the storage device may be sacrificed to prevent a probabilistic recognition failure of the memory device. Therefore, in an example embodiment of the present inventive concept, the default slope of the internal power voltage may be set to an appropriate value under the condition that the probability of failure does not have a maximum value, and the power management device may operate to turn on the power of the memory device again by changing the slope of the internal power voltage only when the controller fails to recognize the memory device.

Referring back to FIG. 10, the probability of a defect may be distributed in the narrowest range in the first graph and may be distributed in the widest range in the third graph. For example, the narrow range of the first graph may be from 100 to 4850 µs/V and the wide range of the third graph may be from 850 to 9650 µs/V. In other words, as the temperature is higher, the probability of a defect that the controller fails to recognize the memory device during the initial driving of the storage device may appear in a narrow range of the slope. On the other hand, as the temperature is lower, a probability of failure that the controller fails to recognize the memory device during the initial driving of the storage device may appear in a wide range of the slope.

In an example embodiment of the present inventive concept, when the controller fails to recognize the memory device, the power management device may reset the slope of the internal power voltage to be different depending on the internal and/or ambient temperature of the storage device, so that the recognition failure may be rapidly corrected. As an example, it is assumed that the default slope is 1500 µs/V and the internal and/or ambient temperature of the storage device is the first temperature T1. In this case, when the controller fails to recognize the memory device and the power management device changes the slope of the internal power voltage to 2000 µs/V, the controller may again fail to recognize the memory device. Accordingly, the power management device must reset the slope of the internal power voltage to a value different from 2000 µs/V and supply the internal power voltage to the memory device. As a result, the response speed of the storage device may be deteriorated.

In an example embodiment of the present inventive concept, when a recognition failure occurs, the power management device may change the slope of the internal power voltage with reference to the internal and/or ambient temperature of the storage device. As an example, under the above conditions, the power management device may change the slope of the internal power voltage to a value of 5000 µs/V or more or 50 µsV or less in consideration of the fact that the internal and/or ambient temperature of the storage device is the first temperature T1. If the internal and/or ambient temperature of the storage device is the second temperature T2, the power management device may change the slope of the internal power voltage to a value of 8000 µs/V or more or 120 µs/V or less.

Accordingly, in an example embodiment of the present inventive concept, when the internal and/or ambient temperature of the storage device is low, the power management device may change the slope of the internal power voltage to be larger when the controller fails to recognize at least one of the plurality of memory devices. When the internal and/or ambient temperature of the storage device is the first temperature T1, the recognition failure of the memory device may be corrected by changing the slope of the internal power voltage to 5000 µs/V or more, but if the internal and/or ambient temperature of the storage device is the second temperature T2, it may be necessary to change the slope of the internal power voltage to 8000 µs/V or more. As such, since the internal and/or ambient temperature of the storage device is low, the power management device may change the slope of the internal power voltage to a greater extent, thereby rapidly fixing the memory device recognition failure of the controller.

In addition, according to an example embodiment of the present inventive concept, when the internal and/or ambient temperature of the storage device is high, the slope may be changed to a value at which the internal power voltage may increase more rapidly. For example, when the internal and/or ambient temperature of the storage device is the first temperature T1, the internal power voltage may be increased very rapidly by changing the slope to 50 µs/V or less. When the internal and/or ambient temperature of the storage device is the third temperature T3, the slope may be changed to 500 µs/V or less. Accordingly, when the temperature is low, the internal power voltage may increase slowly according to the changed slope, and when the temperature is high, the internal power voltage may increase rapidly according to the changed slope.

In order for the power management device to support the operation described above, the data table inside the power management device may store the internal and/or ambient temperature of the storage device by matching the internal and/or ambient temperature of the storage device to the slope of the internal power voltage. If a recognition failure occurs during initial driving of the storage device, the power management device may select a slope most suitable for a temperature detected by the temperature sensor from the data table.

FIG. 11 may be a graph illustrating a slope range of an internal power voltage in which a controller may stably recognize a memory device according to an internal and/or ambient temperature of the storage device. Referring to FIG. 11, at the highest first temperature T1, a slope range in which a recognition failure is suppressed may be a first range R1. In addition, at each of the second temperature T2 and the third temperature T3, slope ranges in which the recognition failure is suppressed may appear as a second range R2 and a third range R3 different from the first range R1.

In the data table, the first to third ranges R1 to R3 indicating a slope in which a recognition failure of the memory device may be suppressed may be matched to the first to third temperatures T1 to T3 and stored. When a memory device recognition failure occurs, the power management device may repeat an operation of selecting a slope from the slope range matched to a temperature detected by the temperature sensor and supplying the internal power voltage increasing to the selected slope to the memory device until the controller successfully recognizes the memory device.

For example, in the case of the highest first temperature T1, the recognition failure may be suppressed in the first range R1 having the smallest voltage slope. Accordingly, when the internal and/or ambient temperature of the storage device is detected as the first temperature T1 or a value close to the first temperature T1, the power management device may reset the power of the memory device to the internal power voltage at which the voltage slope is reduced to a value within the first range R1, thereby resolving the recognition failure.

Similarly, in the case of the lowest third temperature T3, the recognition failure may be suppressed in the third range R3 having the largest voltage slope. Accordingly, when the internal and/or ambient temperature of the storage device is detected as the third temperature T3 or a value close to the third temperature T3, the power management device may reset the power of the memory device to the internal power voltage at which the voltage slope is reduced to a value within the third range R3, thereby resolving the recognition failure.

In the range of the horizontal axis shown in the graph of FIG. 11, an example embodiment of the present inventive concept in which the recognition failure is resolved by resetting the power of the memory device to the internal power voltage that slowly increases by increasing the slope of the internal power voltage may not be illustrated. However, as described above with reference to FIG. 10, when the slope of the internal power voltage has a very large value, a defect in which the controller fails to recognize the memory device at a specific slope of the internal power voltage may hardly appear stochastically. Accordingly, if necessary, the recognition failure may also be resolved by resetting the power of the memory device to the internal power voltage that slowly increases by increasing the slope of the internal power voltage.

Figure 12:
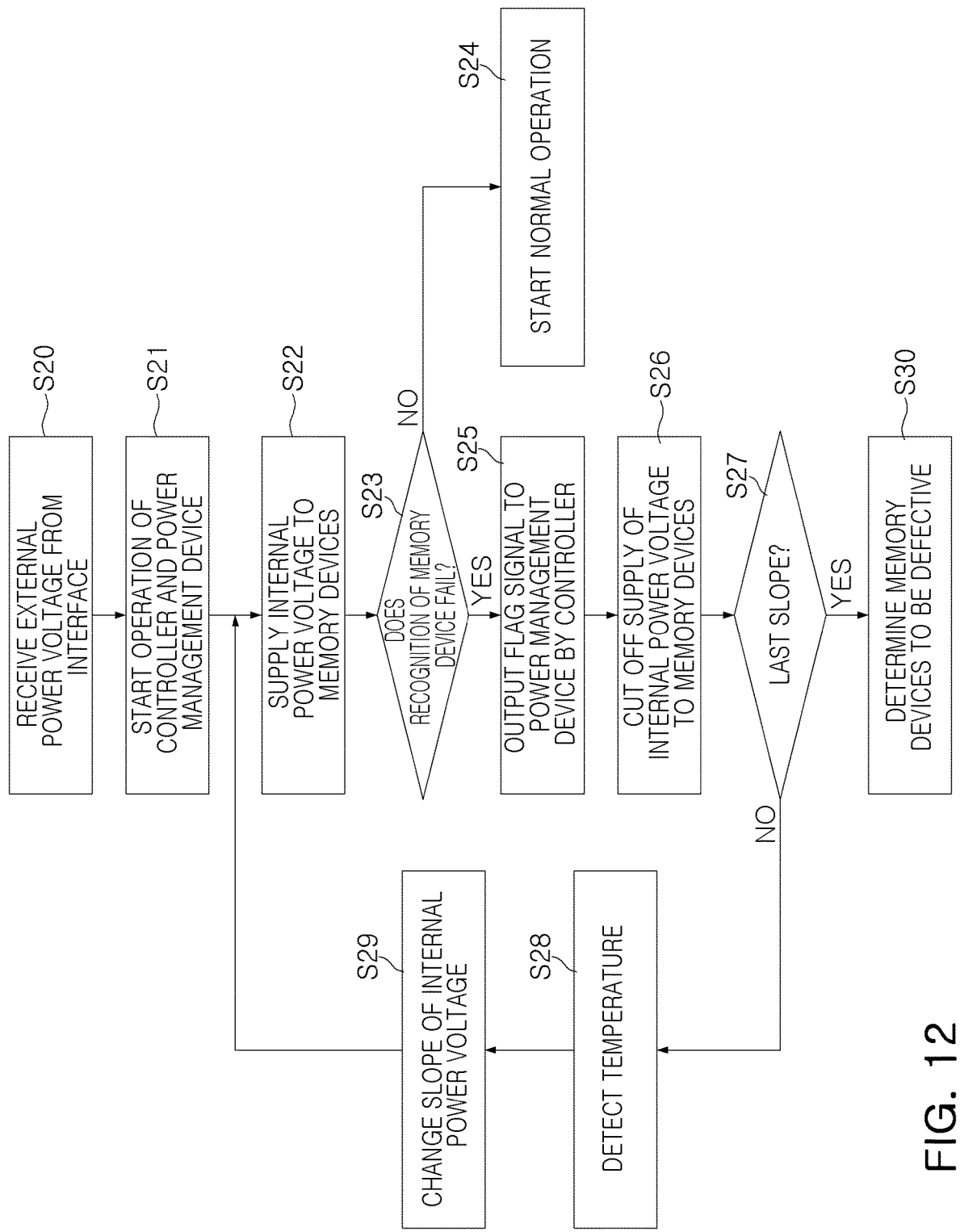
FIG. 12 is a flowchart illustrating an operation of a storage device according to an example embodiment of the present inventive concept.

FIG. 12 is a flowchart illustrating an operation of a storage device according to an example embodiment of the present inventive concept.

Referring to FIG. 12, an operation of the storage device according to an example embodiment of the present inventive concept may be started by receiving an external power voltage through an interface (S20). The storage device may be connected to a host through various types of interfaces, for example, one of USB, SATA, PCI-Express, and the like, and may receive an external power voltage output from the host.

When the external power voltage starts to be supplied, the power management device and the controller included in the storage device may start to operate (S21). The power management device may generate an internal power voltage using an external power voltage and supply the generated internal power voltage to the memory devices and the controller. However, the internal power voltage required for the operation of the controller may be less than the internal power voltage required for the operation of the memory devices, and thus the controller may start to operate before the memory devices.

The power management device may supply an internal power voltage to the memory devices (S22), and the controller may recognize the memory devices. In other words, the controller may confirm the presence of the memory devices in the storage device. The controller may determine whether there is a memory device that has failed to be recognized among the memory devices (S23). If there is no memory device that has failed to be recognized in step S23, the storage device may start to operate normally (S24).

On the other hand, if there is a memory device that is not normally recognized by the controller among the memory devices, the controller may output a flag signal to the power management device (S25). In other words, if the controller does not receive a signal from the memory device acknowledging its presence in the storage device, the controller may output a flag signal to the power management device. For example, in operation S25, the controller may output a flag signal having a first voltage level to the power management device.

Upon receiving the flag signal having the first voltage level, the power management device may cut off supply of the internal power voltage to the memory devices (S26). Accordingly, the power of the memory devices may be turned off. When the power of the memory devices is turned off, the power management device may determine whether a slope applied to the internal power voltage supplied to the memory devices is the last slope among selectable slopes (S27).

If the slope applied to the internal power voltage is not the last slope as a result of the determination in operation S27, the temperature sensor inside the power management device may detect a temperature (S28) and the power management device may change the slope to be applied to the internal power voltage (S29). As described above, a plurality of slopes or slope ranges matched to temperature may be stored in the data table to be accessible by the power management device. The power management device may select one slope from the slopes or the slope range matched to the temperature detected in step S28.

The power management device may supply the internal power voltage to which the slope changed in step S29 to the memory devices (S22). Accordingly, the internal power voltage increasing to a target level according to the changed slope may be supplied to the memory devices, and the memory devices may be turned on again. The controller may determine whether there is a memory device that has failed to be recognized among the memory devices (S23). If there is no memory device that has failed to be recognized in step S23, the storage device may start to operate normally (S24). If there is no memory device that has failed to be recognized, the controller may output the flag signal by changing a level of the flag signal from the first voltage level to the second voltage level. For example, the first voltage level may be greater than the second voltage level.

On the other hand, if there is a memory device that has failed to be recognized in step S23, the controller may again output the flag signal having the first voltage level, and the power management device may repeat an operation of resetting the power of the memory device by changing the slope of the internal power voltage again. The power management device may repeat the operation of resetting the power of the memory device until the memory device is successfully recognized or until the power of the memory device is turned on with the internal power voltage to which each of the slopes stored in the data table is applied.

As a result of the determination in step S27, if the slope of the internal power voltage supplied to the memory device is the last selectable slope in the data table, the controller may determine that the memory device recognition failure is not due to a defect occurring at a specific slope of the internal power voltage. Accordingly, the controller may determine that the memory devices are defective (S30), and output the failure occurrence to the user and/or the administrator of the storage device.

Figure 13:
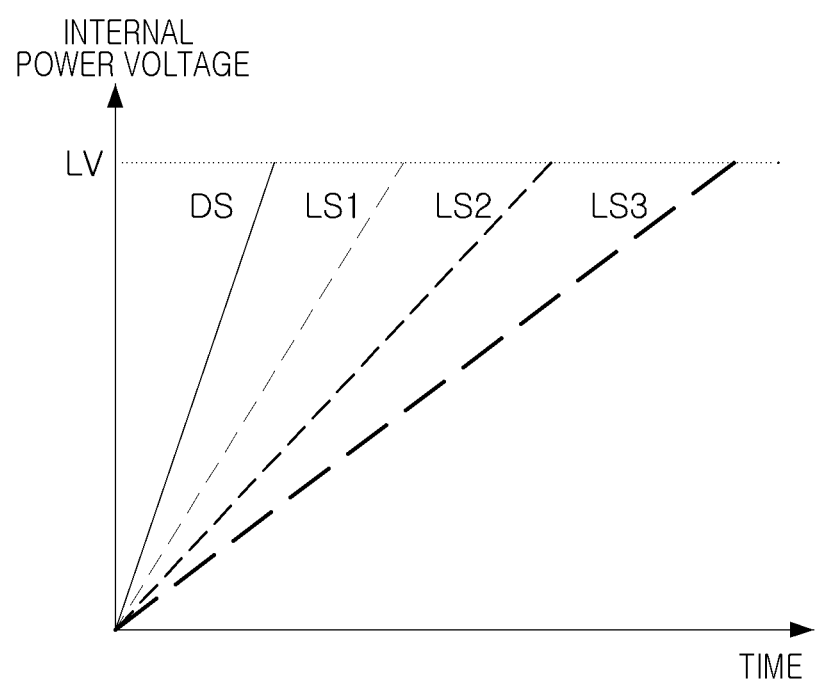
FIGS. 13 and 14 are diagrams illustrating an operation of a power management device according to an example embodiment of the present inventive concept.
Figure 14:
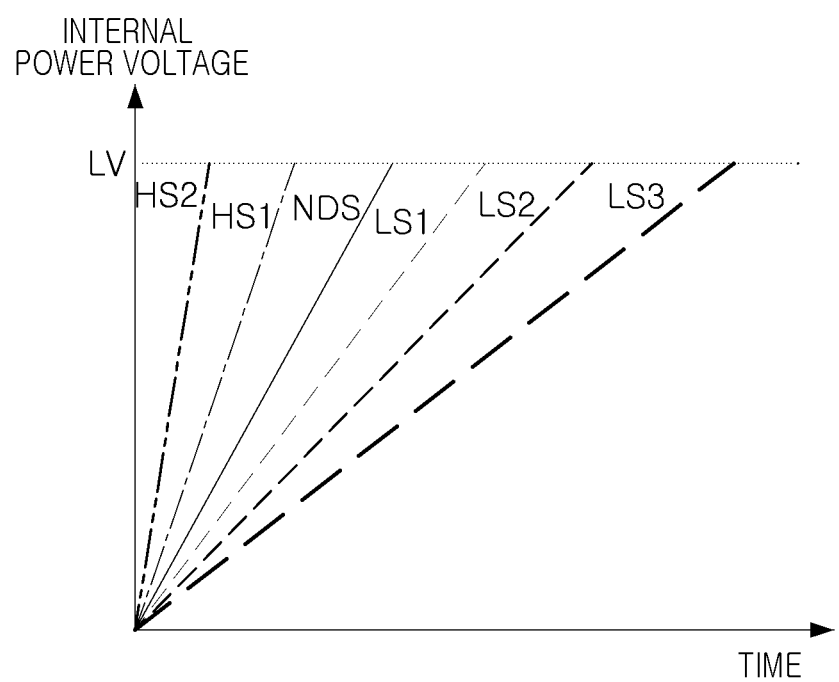

FIGS. 13 and 14 are diagrams illustrating an operation of a power management device according to an example embodiment of the present inventive concept.

When the storage device starts to operate, the power management device may supply an internal power voltage increasing to a target level LV according to a default slope DS to the memory devices. However, as described above, when the internal power voltage, which increases according to a specific slope, is supplied to the memory devices, the controller may fail to recognize at least one of the memory devices.

In this case, the power management device may supply the internal power voltage increasing to the target level LV according to a first low slope LS1 different from the default slope DS to the memory devices. The internal power voltage to which the first low slope LS1 is applied may increase more slowly to the target level LV than the internal power voltage to which the default slope DS is applied.

Even when the power of the memory devices is turned on by the internal power voltage to which the first low slope LS1 is applied, the controller may not successfully recognize the memory devices. In this case, the power management device may supply an internal power voltage increasing according to a second low slope LS2 slower than the first low slope LS1 to the memory devices. If the controller does not successfully recognize the memory devices even when the power of the memory devices is turned on with the internal power voltage to which the second low slope LS2 is applied, the power management device may turn on the power of the memory devices again with the internal power voltage increasing according to a third low slope LS3. The third low slope LS3 may be slowed than the second low slope LS2.

In the example embodiment shown in FIG. 13, when the controller successfully recognizes memory devices turned on with the internal power voltage increasing to the target level LV according to the first low slope LS1, the power management device may set the first low slope LS1 as a new default slope NDS. Referring to FIG. 14, the power management device may supply the internal power voltage increasing to the target level LV according to the new default slope NDS such as the first low slope LS1 to the memory devices.

In the example embodiment illustrated in FIG. 14, if the controller does not recognize memory devices turned on by the internal power voltage to which the new default slope NDS is applied, the power management device may change the slope again. In the example embodiment illustrated in FIG. 14, the power management device may select the slope of the internal power voltage as one of low slopes LS1 to LS3 slower than the new default slope NDS and high slopes HS1 and HS2 faster than the new default slope NDS. The power management device may turn on the power of the memory devices with the internal power voltage applied to each of all the slopes LS1 to LS3 and HS1 and HS2, or repeat an operation of resetting the power of the memory devices by changing the slope of the internal power voltage until the controller successfully recognizes the memory devices.

The operation of the power management device that repeats resetting the power of memory devices while changing the slope of the internal power voltage according to an example embodiment of the present inventive concept may be similarly applied to a DRAM as well as nonvolatile memory devices inside the storage device. When the storage device includes a DRAM, the DRAM may also operate by an internal power voltage output from the power management device. If the controller fails to recognize the DRAM, the power management device may repeatedly resetting power of the DRAM and change the slope of the internal power voltage until the controller succeeds in recognizing the DRAM. In an example embodiment of the present inventive concept, the slopes applicable to the internal power voltage supplied to the DRAM may be stored in the data table separately from the slopes applicable to the nonvolatile memory devices.

Figure 15:
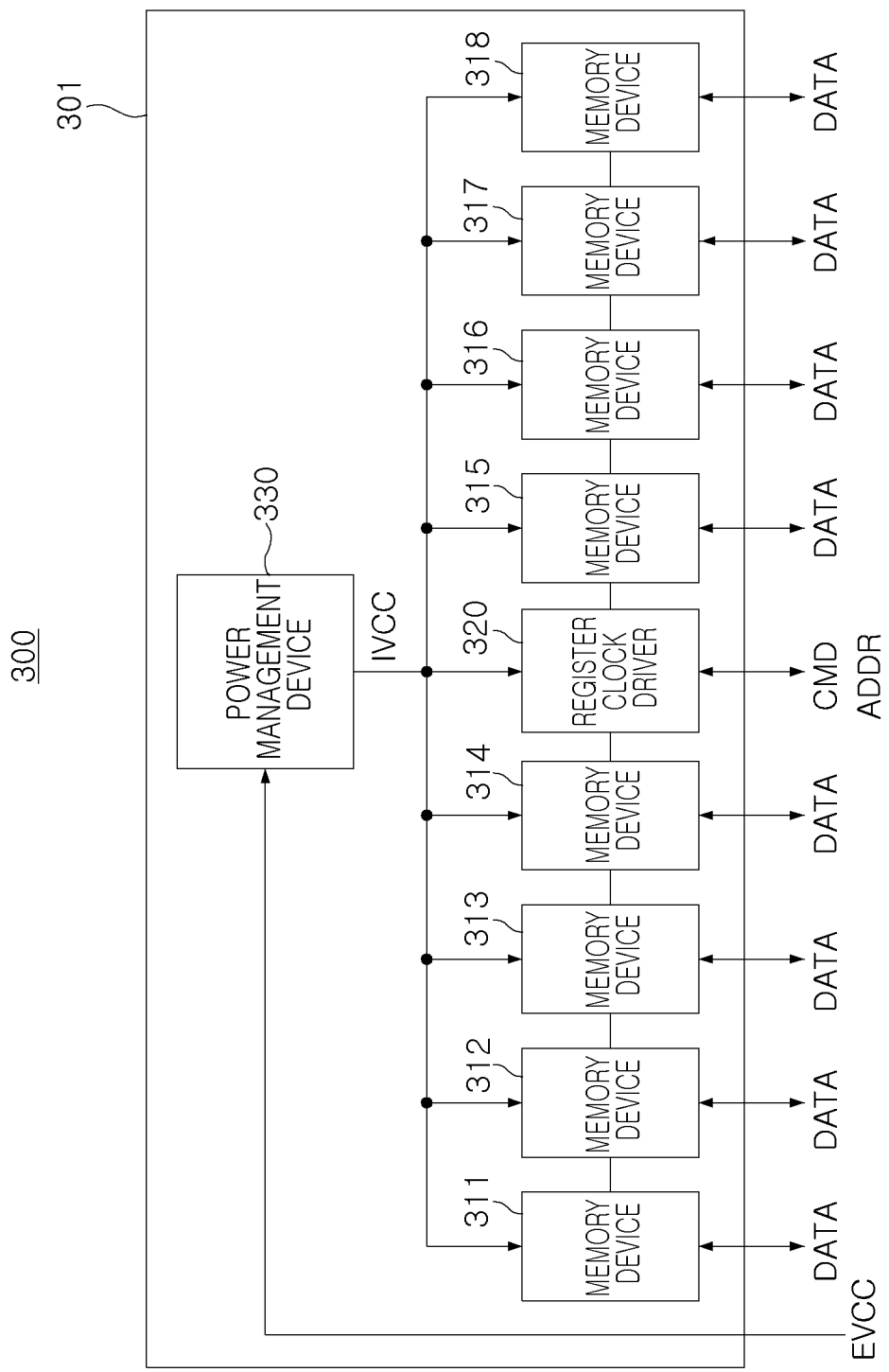
FIG. 15 is a diagram schematically illustrating a storage device according to an example embodiment of the present inventive concept.

FIG. 15 is a diagram schematically illustrating a storage device according to an example embodiment of the present inventive concept.

Referring to FIG. 15, a storage device 300 according to an example embodiment of the present inventive concept may include a plurality of memory devices 311, 312, 313, 314, 315, 316, 317 and 318, a register clock driver 320, a power management device 330, and the like. The plurality of memory devices 311 to 318, the register clock driver 320, and the power management device 330 may be mounted on a printed circuit board (PCB) 301.

Each of the plurality of memory devices 311 to 318 may include a memory cell array, a row decoder, a column decoder, a sense amplifier, an input/output circuit, control logic, and the like. The memory cell array may include a plurality of memory banks, and each of the plurality of memory banks may include a plurality of memory cells connected to a plurality of word lines and a plurality of bit lines. For example, each of the plurality of memory cells may include at least one switch element and at least one data storage element, and in an example embodiment of the present inventive concept, the data storage element may include a capacitor, a variable resistance element, a magnetic memory element, and the like. Each of the plurality of memory devices 311 to 318 may transmit and receive data to and from an external device, for example, a host, through pads formed on the PCB 301.

The register clock driver 320 may receive a command signal CMD and an address signal ADDR from an external device, and transmit the command signal CMD and the address signal ADDR to the plurality of memory devices 311 to 318. The power management device 330 may receive an external power voltage EVCC from an external device through a pad formed on the PCB 301. The power management device 330 may generate an internal power voltage IVCC required for an operation of the plurality of memory devices 311 to 318 and the register clock driver 320 using the external power voltage EVCC.

The external power voltage EVCC is input to the storage device 300, and during initial driving in which the power management device 330 supplies the internal power voltage IVCC to the plurality of memory devices 311 to 318 and the register clock driver 320, the register clock driver 320 may fail to recognize at least one of the plurality of memory devices 311 to 318. However, this may not be an actual failure of the plurality of memory devices 311 to 318 and the register clock driver 320, but rather a failure in that at least one of the plurality of memory devices 311 to 318 is not recognized, in a stochastic manner, due to the slope of the internal power voltage IVCC.

In this case, in the example embodiment shown in FIG. 15, the power management device 330 may reset the power of the plurality of memory devices 311 to 318 by changing the slope of the internal power voltage IVCC. When the register clock driver 320 fails to recognize at least one of the plurality of memory devices 311 to 318, the power management device 330 may turn off the power of the plurality of memory devices 311 to 318 by cutting off the supply of the internal power voltage IVCC to the plurality of memory devices 311 to 318

Thereafter, the power management device 330 may select another slope applicable to the internal power voltage IVCC by referring to the data table, and supply the internal power voltage IVCC that increases to a target level according to the selected slope to the plurality of memory devices 311 to 318. The power management device 330 may repeat the operation as described above until the register clock driver 320 succeeds in recognizing the plurality of memory devices 311 to 318 or there is no other slope applicable to the internal power voltage IVCC.

According to example embodiments of the present inventive concept, when an external power voltage is input through the interface and the power management device outputs the internal power voltage to the controller and the memory device, the controller may determine whether the memory device is normally recognized. When the memory device is not normally recognized, the controller may output a flag signal to the power management device, and the power management device may turn off the power of the memory device by stopping the output of the internal power voltage in response to the flag signal. The power management device may turn on the power of the memory device back on by changing the slope of the internal power voltage by referring to the pre-stored data table and supplying the internal power voltage to the memory device. Accordingly, the operational stability and reliability of the storage device may be increased by avoiding defects that may occur stochastically due to the slope of the internal power voltage.

What is claimed is:

1. A storage device, comprising:
a controller configured to be connected to an external host through an interface;
a plurality of memory devices configured to store data; and
a power management device configured to output an internal power voltage for an operation of the plurality of memory devices using an external power voltage received through the interface and having a flag signal pad for receiving a flag signal from the controller when the controller fails to recognize at least one of the plurality of memory devices,
wherein, when the flag signal is received, the power management device changes a slope of the internal power voltage, and supplies the internal power voltage having the changed slope to the plurality of memory devices.

2. The storage device of claim 1, wherein
the power management device includes a temperature sensor for detecting a temperature and a power circuit for changing the slope of the internal power voltage, and
a data table that stores a defective rate of the plurality of memory devices according to the temperature and the slope of the internal power voltage.

3. The storage device of claim 2, wherein, when the flag signal is received, the power management device changes the slope of the internal power voltage so that the internal power voltage increases more than prior to the flag signal being received.

4. The storage device of claim 3, wherein the power circuit changes the slope of the internal power voltage as the temperature is decreased.

5. The storage device of claim 1, wherein, when the flag signal is received, the power management device turns off a power of the plurality of memory devices before changing the slope of the internal power voltage.

6. The storage device of claim 5, wherein the power management device supplies the internal power voltage having the changed slope to the plurality of memory devices, and when the controller recognizes the plurality of memory devices, the power management device sets the changed slope as a default slope of the internal power voltage.

7. The storage device of claim 6, wherein the power management device stores the changed slope as the default slope in a data table.

8. The storage device of claim 1, wherein the plurality of memory devices directly receive an input/output power voltage for an input/output operation from the external host through the interface, and a level of the input/output power voltage is lower than a level of the internal power voltage.

9. The storage device of claim 1, wherein, when the controller does not recognize at least one of the plurality of memory devices, while the power management device supplies the internal power voltage to the plurality of memory devices, after sequentially applying slopes corresponding to the internal power voltage stored in a data table to the internal power voltage, the controller determines the plurality of memory devices to be defective.

* * * * *